United States Patent
Itakura et al.

(10) Patent No.: US 9,543,961 B2
(45) Date of Patent: Jan. 10, 2017

(54) CURRENT DETECTION CIRCUIT AND PILE-UP DETECTION CIRCUIT

(71) Applicant: KABUSHIKI KAISHA TOSHIBA, Tokyo (JP)

(72) Inventors: Tetsuro Itakura, Tokyo (JP); Masanori Furuta, Kanagawa (JP); Shunsuke Kimura, Kanagawa (JP); Hideyuki Funaki, Tokyo (JP); Go Kawata, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 14/636,593

(22) Filed: Mar. 3, 2015

(65) Prior Publication Data

US 2015/0270840 A1    Sep. 24, 2015

(30) Foreign Application Priority Data

Mar. 19, 2014 (JP) .................. 2014-057044
Jul. 7, 2014 (JP) .................. 2014-139940

(51) Int. Cl.
| | | |
|---|---|---|
| *H03K 5/153* | (2006.01) | |
| *H03K 21/38* | (2006.01) | |
| *H03K 5/24* | (2006.01) | |
| *G01R 19/15* | (2006.01) | |
| *G01R 1/20* | (2006.01) | |
| *G01R 19/00* | (2006.01) | |

(52) U.S. Cl.
CPC ........... *H03K 21/38* (2013.01); *G01R 19/0092* (2013.01); *G01R 19/15* (2013.01); *H03K 5/24* (2013.01); *G01R 1/203* (2013.01); *G01R 19/0023* (2013.01)

(58) Field of Classification Search
CPC ........ H03K 5/2481; H03K 5/249; H03K 5/08; H03K 5/24; G01R 19/16519
USPC ........................................... 327/77
See application file for complete search history.

(56) References Cited

U.S. PATENT DOCUMENTS 8,386,828 B1 *  2/2013  Ambatipudi et al. ........ 713/500
8,766,746 B2    7/2014  Nedovic
(Continued)

FOREIGN PATENT DOCUMENTS

JP        7-229861     8/1995
JP        10-96784     4/1998
(Continued)

*Primary Examiner* — Quan Tra
(74) *Attorney, Agent, or Firm* — Finnegan, Henderson, Farabow, Garrett & Dunner LLP

(57) ABSTRACT

A current detection circuit according to one embodiment includes a low-pass filter, a voltage-to-current converter circuit, and a comparator. The low-pass filter has a first terminal connected to a signal input terminal to which a signal current is input. The voltage-to-current converter circuit has a first terminal connected to a second terminal of the low-pass filter and has a second terminal connected to the signal input terminal. The comparator has a first input terminal and a second input terminal and outputs a signal according to a difference between a signal input through the first input terminal and a signal input through the second input terminal, the first input terminal being connected to the second terminal of the low-pass filter, and the second input terminal being connected to the second terminal of the voltage-to-current converter circuit.

11 Claims, 14 Drawing Sheets

(56) References Cited

U.S. PATENT DOCUMENTS

| | | | |
|---|---|---|---|
| 8,835,830 B2 | 9/2014 | Uemura et al. | |
| 2009/0039273 A1* | 2/2009 | Tkaczyk et al. | 250/370.06 |
| 2010/0003940 A1* | 1/2010 | Sanji et al. | 455/254 |
| 2013/0300512 A1* | 11/2013 | O'Keeffe et al. | 331/116 FE |
| 2014/0231646 A1 | 8/2014 | Makino et al. | |

FOREIGN PATENT DOCUMENTS

| | | |
|---|---|---|
| JP | 2001-337168 | 12/2001 |
| JP | 2003-168933 | 6/2003 |
| JP | 2009-229127 | 10/2009 |
| JP | 2012-204885 | 10/2012 |
| JP | 2013-70375 | 4/2013 |
| JP | 2013-76676 | 4/2013 |

* cited by examiner

CURRENT DETECTION CIRCUIT AND PILE-UP DETECTION CIRCUIT

CROSS REFERENCE TO RELATED APPLICATION(S)

This application is based upon and claims the benefit of priority from the prior Japanese Patent Application No. 2014-057044, filed on Mar. 19, 2014, and prior Japanese Patent Application No. 2014-139940, filed on Jul. 7, 2014, the entire contents all of which are incorporated herein by reference.

FIELD

Embodiments described herein relate generally to a current detection circuit and a pile-up detection circuit.

BACKGROUND

Conventionally, there is known a current detection circuit that detects an input signal current. The current detection circuit uses, for example, a method of detecting a signal current by comparing an input signal generated from the signal current with a predetermined reference signal. The reference signal is normally set according to the direct-current component of the signal current. However, when the signal current is input on an irregular basis, the direct-current component of the signal current changes according to the frequency of input. Thus, it is difficult to accurately detect a signal current even if an input signal is compared with a predetermined reference signal.

To solve such a problem, there is proposed a method of detecting a signal current by comparing a reference signal with an input signal to which the signal current is converted with the direct-current component of the signal current removed. However, the method requires a plurality of amplifier circuits, which may cause an increase in the power consumption of the current detection circuit.

DETAILED DESCRIPTION

Embodiments will now be explained with reference to the accompanying drawings. The present invention is not limited to the embodiments.

A current detection circuit according to one embodiment includes a low-pass filter, a voltage-to-current converter circuit, and a comparator. The low-pass filter is input a signal current and has a first terminal connected to a signal input terminal to which the signal current is input. The voltage-to-current converter circuit is input an output signal of the low-pass filter and has a first terminal connected to a second terminal of the low-pass filter and has a second terminal connected to the signal input terminal. The comparator is input the output signal of the low-pass filter and an output signal of the voltage-to-current converter circuit. The comparator has a first input terminal and a second input terminal and outputs a signal according to a difference between a signal input through the first input terminal and a signal input through the second input terminal, the first input terminal being connected to the second terminal of the low-pass filter, and the second input terminal being connected to the second terminal of the voltage-to-current converter circuit.

(First Embodiment)

Figure 1:
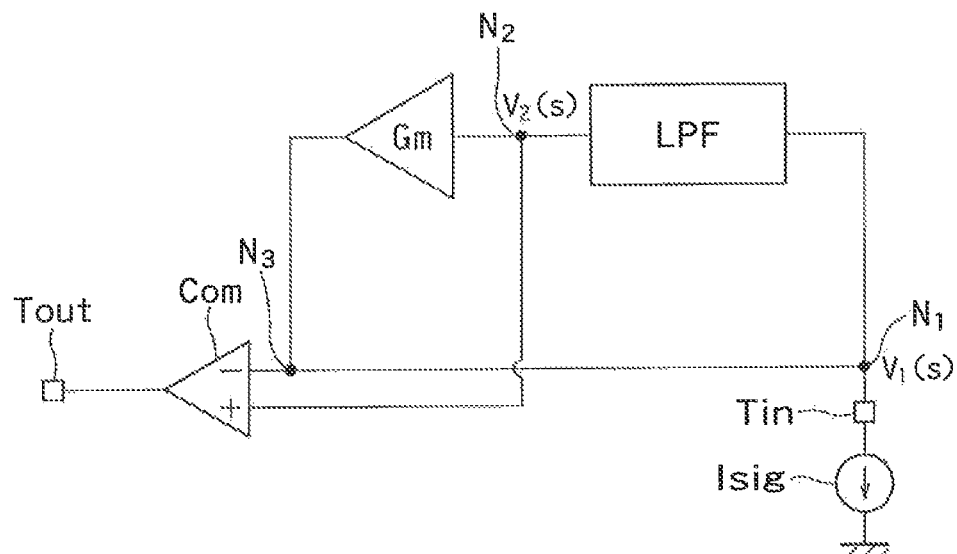
FIG. 1 is a schematic diagram showing a current detection circuit according to a first embodiment.

First, a current detection circuit according to a first embodiment will be described with reference to FIGS. 1 to 4. FIG. 1 is a schematic diagram showing a current detection circuit according to the first embodiment. As shown in FIG. 1, the current detection circuit according to the present embodiment includes an input terminal Tin (signal input terminal), a low-pass filter LPF, a voltage-to-current converter circuit Gm, a comparator Com, and an output terminal Tout.

The input terminal Tin is an input terminal of the current detection circuit. A signal current I to be detected by the current detection circuit is superimposed on a predetermined bias current and the resulting current is input through the input terminal Tin. A current source Isig shown in FIG. 1 schematically shows a signal source of the signal current I, and inputs the signal current I through the input terminal Tin. The signal source is any circuit or element that generates the signal current I and thus is not limited to the current source Isig.

The low-pass filter LPF (hereinafter, referred to as the "filter LPF") is connected at its input terminal (first terminal) to the input terminal Tin and connected at its output terminal (second terminal) to an input terminal of the voltage-tocurrent converter circuit Gm and a positive input terminal of the comparator Com. The filter LPF allows the low-frequency components of the signal current I input through the input terminal Tin to pass therethrough, and attenuates the high-frequency components of the signal current I. Specifically, the filter LPF allows frequency components lower than or equal to a cutoff frequency to pass therethrough as low-frequency components, and attenuates frequency components higher than the cutoff frequency as high-frequency components. The filter LPF may be a first-order filter or may be a second- or higher-order filter. A connection point between the input terminal Tin and the input terminal of the filter LPF is hereinafter referred to as a node $N_1$, and a connection point between the output terminal of the filter LPF and the input terminal of the voltage-to-current converter circuit Gm is hereinafter referred to as a node $N_2$.

The voltage-to-current converter circuit Gm (hereinafter, referred to as the "converter circuit Gm") is connected at its input terminal (first terminal) to the node $N_2$ and connected at its output terminal (second terminal) to the node $N_1$ and a negative input terminal of the comparator Com. The converter circuit Gm outputs a current according to an input voltage. The converter circuit Gm is composed of, for example, a transistor. A connection point between the output terminal of the converter circuit Gm and the negative input terminal of the comparator Com is hereinafter referred to as a node $N_3$. In the present embodiment, the node $N_1$ coincides with the node $N_3$.

The comparator Com has the positive input terminal (first input terminal), the negative input terminal (second input terminal), and an output terminal. The positive input terminal is connected to the node $N_2$, the negative input terminal is connected to the node $N_1$ and the node $N_3$, and the output terminal is connected to the output terminal Tout of the current detection circuit. The comparator Com compares a reference voltage input through the positive input terminal with a signal voltage input through the negative input terminal and outputs a signal according to the difference between the reference voltage and the signal voltage. For example, the comparator Com outputs a first signal when the signal voltage is larger than the reference voltage, and outputs a second signal when the signal voltage is smaller than the reference voltage. In the present embodiment, the reference voltage is a voltage $V_2$ at the node $N_2$ and the signal voltage is a voltage $V_1$ at the nodes $N_1$ and $N_3$. The comparator Com is composed of, for example, an operational amplifier.

Next, the operation of the current detection circuit according to the present embodiment will be described. In the following, the magnitude of a signal current is represented as $I(s)$, the voltage at the input terminal Tin as $V_1(s)$, the voltage at the output terminal of the filter LPF as $V_2(s)$, the transfer function of the filter LPF as $H_{LPF}(s)$, the voltage-to-current conversion factor of the converter circuit Gm as Gm, and the output resistance of the converter circuit Gm as $r_o$, and it is assumed that the output resistance $r_o$ is sufficiently greater than the reciprocal of the voltage-to-current conversion factor (1/Gm) ($r_o$>1/Gm). When $H_{LPF}(s)=1/(1+s/\omega_c)$, a signal voltage input to the negative input terminal of the comparator Com, i.e., the voltage $V_1$, is represented by the following equation:

$$V_1(s) = I(s) \cdot r_o/(1 + H_{LPF}(s) \cdot Gm \cdot r_o) = \qquad (1)$$
$$I(s) \cdot r_o \cdot (1 + s/\omega_c)/(1 + Gm \cdot r_o + s/\omega_c)$$

In the above-described equation (1), $\omega_c$ is the cutoff frequency of the filter LPF and s is the Laplace variable. From equation (1) it can be seen that the low-frequency components of the signal current I are converted to the voltage $V_1$ with a gain of substantially 1/Gm and the high-frequency components of the signal current I are converted to the voltage $V_1$ with a gain of substantially $r_o$. As described above, since $r_o$>1/Gm, the signal voltage is the voltage $V_1$ where the high-frequency components of the signal current I are amplified more than the low-frequency components.

On the other hand, a reference voltage input to the positive input terminal of the comparator Com, i.e., the voltage $V_2$, is represented by the following equation:

$$V_2(s)=I(s)r_o/(1+Gm \cdot r_o+s/\omega_c) \qquad (2)$$

From the above-described equation (2) it can be seen that the low-frequency components of the signal current I are converted to the voltage $V_2$ with a gain of substantially 1/Gm and the high-frequency components of the signal current I are converted to the voltage $V_2$ with a smaller gain than 1/Gm.

Figure 2:
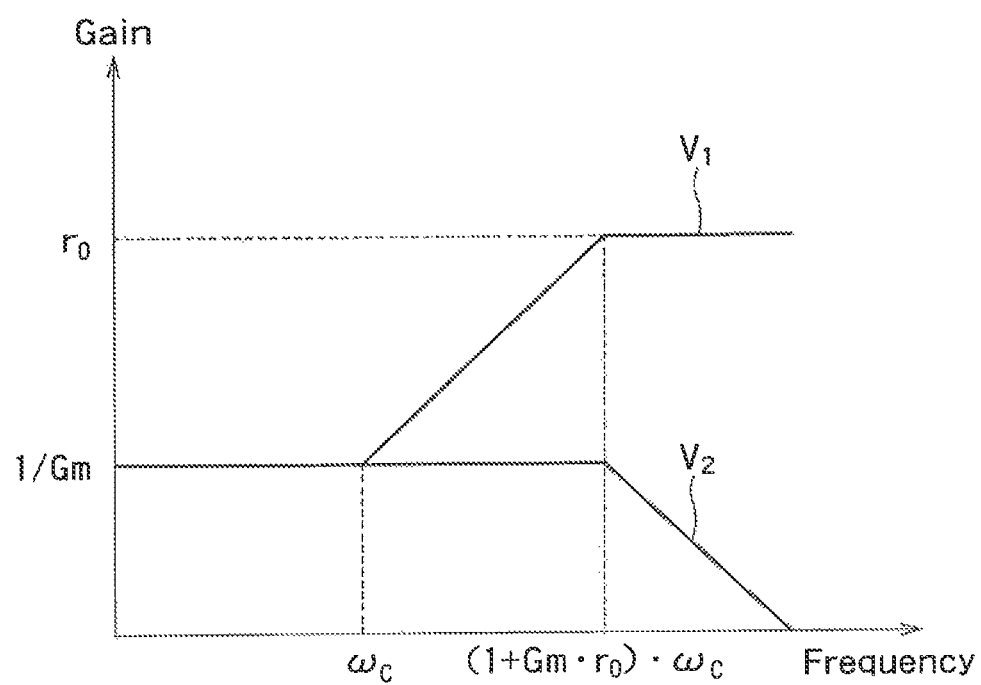
FIG. 2 is a schematic diagram showing the frequency characteristics of the current detection circuit according to the first embodiment.

FIG. 2 is a schematic diagram showing in graph form the frequency characteristics of the current detection circuit which are represented by equation (1) and equation (2), and the vertical axis represents gain and the horizontal axis represents frequency. As shown in FIG. 2, the low-frequency components of the signal current I are converted to a voltage $V_1$ and a voltage $V_2$ with substantially the same gain. Therefore, upon no signal, i.e., when a signal current I is not input and only a bias current is input through the input terminal Tin, a reference voltage and a signal voltage which are input to the comparator Com are substantially the same voltage.

On the other hand, the high-frequency components of the signal current I are converted to a voltage $V_1$ with a high gain and converted to a voltage $V_2$ with a low gain. Therefore, when a signal current I containing high-frequency components is input, a voltage $V_1$ in which the high-frequency components are emphasized and amplified is larger than a voltage $V_2$ in which the high-frequency components are suppressed and amplified. When a signal current I is input, regardless of the magnitude of the signal current I, upon a rise, the current suddenly changes, i.e., many high-frequency components are contained. Hence, when a signal current I is input, regardless of the magnitude of the signal current I, the voltage $V_1$ is larger than the voltage $V_2$. The voltage $V_1$ and the voltage $V_2$ are input to the comparator Com.

As described above, the current detection circuit according to the present embodiment detects a signal current I by comparing, by the comparator Com, a voltage $V_1$ to which the high-frequency components of an input current I are emphasized and converted, with a voltage $V_2$ to which the high-frequency components of the input current I are suppressed and converted. Upon the input of the signal current I, since many high-frequency components are contained and thus the difference between the voltage $V_1$ and the voltage $V_2$ is emphasized, even when the signal current I is small, the signal current I can be detected accurately.

In addition, the reference voltage (voltage $V_2$) which is compared with the input voltage (voltage $V_1$) is generated from the signal current I and thus changes according to a change in the frequency of input of the signal current I. Therefore, even when the signal current I is input on an irregular basis and the direct-current component of the signal current I changes, the reference voltage changes in accordance with the direct-current component. By this, even when the signal current I is input on an irregular basis, the current detection circuit according to the present embodiment can accurately detect the signal current I.

Figure 3:
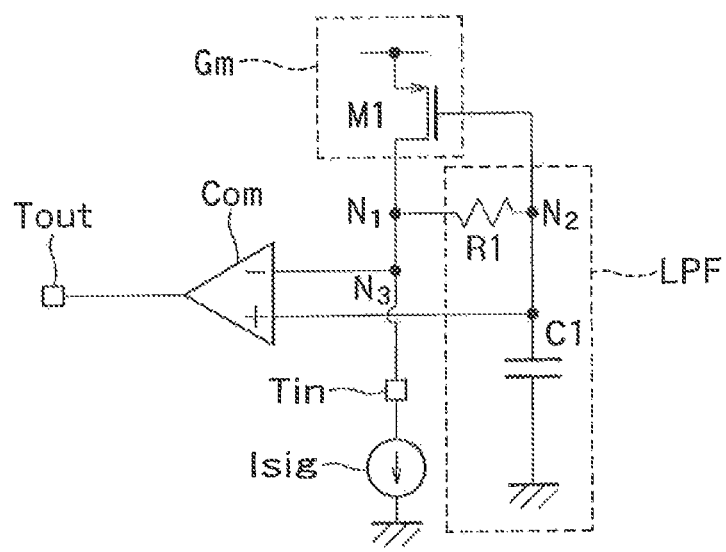
FIG. 3 is a circuit diagram showing an example of the current detection circuit of FIG. 1.

FIG. 3 is a circuit diagram showing an example of the current detection circuit according to the present embodiment. In the current detection circuit of FIG. 3, the filter LPF includes a resistance element R1 and a capacitance element C1. The resistance element R1 is connected at its one end to the node $N_1$ and connected at its other end to the node $N_2$. The capacitance element C1 is grounded at its low-voltage side terminal and connected to the node $N_2$ at its high-voltage side terminal. Therefore, the input terminal of the filter LPF shown in FIG. 3 is the one end of the resistance element R1, and the output terminal is the other end of the resistance element R1 and the high-voltage side terminal of the capacitance element C1. The cutoff frequency $\omega_c$ of the filter LPF is represented by $1/R1 \cdot C1$.

In addition, in the current detection circuit of FIG. 3, the converter circuit Gm is composed of a transistor M1. The transistor M1 is a P-type MOS transistor, and is connected at its gate terminal to the node $N_2$, and connected at its source terminal to a power supply, and connected at its drain terminal to the node $N_3$. Therefore, the input terminal of the converter circuit Gm shown in FIG. 3 is the gate terminal of the transistor M1, and the output terminal is the drain terminal of the transistor M1. The voltage-to-current conversion factor Gm of the converter circuit Gm is represented by the transconductance of the transistor M1.

In the current detection circuit shown in FIG. 3, since the converter circuit Gm is composed of one transistor, the circuit size can be reduced. In addition, since a bias current supplied from the current source Isig is used as a bias current of the transistor M1, the power consumption of the current detection circuit can be reduced.

Figure 4:
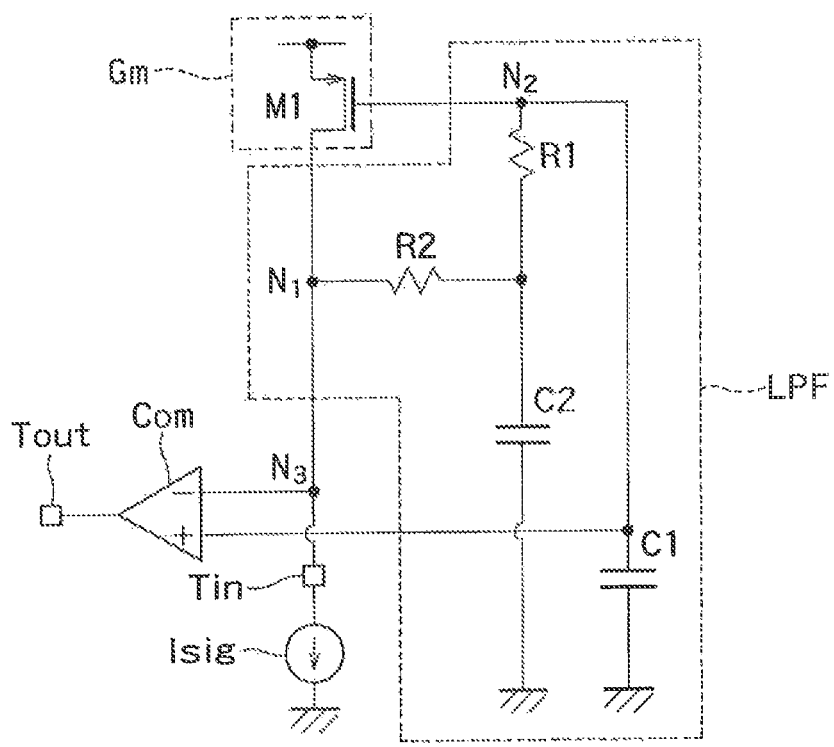
FIG. 4 is a circuit diagram showing another example of the current detection circuit of FIG. 1.

Note that the configuration of the current detection circuit according to the present embodiment is not limited to that shown in FIG. 3. For example, the filter LPF may be a higher-order filter. FIG. 4 is a circuit diagram showing a current detection circuit including a second-order filter LPF. The filter LPF of FIG. 4 includes a resistance element R1, a capacitance element C1, a resistance element R2, and a capacitance element C2. The resistance element R2 is connected between the resistance element R1 and the node $N_1$, and the capacitance element C2 is connected at its high-voltage side terminal to a connection point between the resistance element R1 and the resistance element R2. By thus increasing the order of the filter LPF, the filter characteristics can be made abrupt.

(Second Embodiment)

Figure 5:
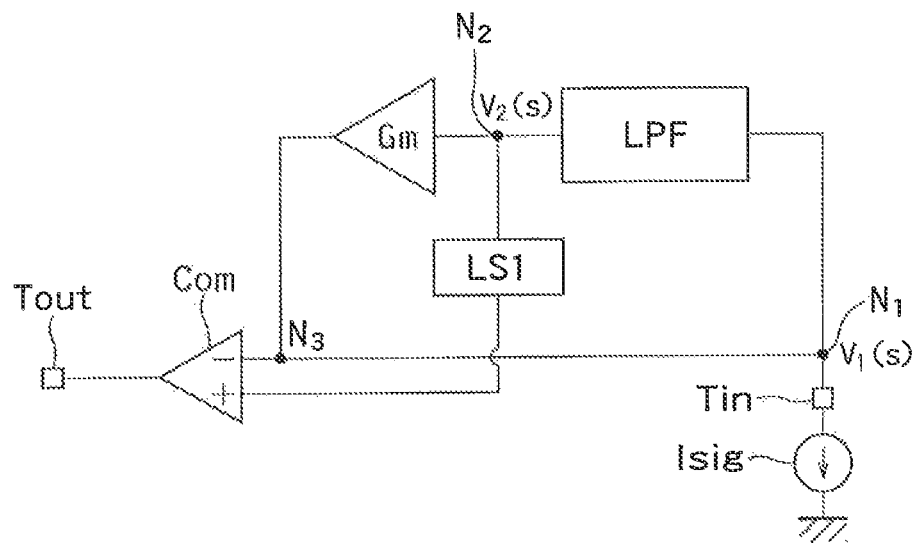
FIG. 5 is a schematic diagram showing a current detection circuit according to a second embodiment.

Next, a current detection circuit according to a second embodiment will be described with reference to FIGS. 5 to 8. FIG. 5 is a schematic diagram showing a current detection circuit according to the present embodiment. As shown in FIG. 5, the current detection circuit according to the present embodiment includes a level shift circuit LS1. Other configurations are the same as those of the first embodiment.

The level shift circuit LS1 is connected between a node $N_2$ and a positive input terminal of a comparator Com, and reduces a voltage $V_2$ at the node $N_2$ by a predetermined voltage $V_{th}$ and inputs the resulting voltage to the comparator Com. To the comparator Com is input $V_1$ as an input voltage and is input $V_2 - V_{th}$ as a reference voltage.

The current detection circuit according to the present embodiment can arbitrarily set, by the level shift circuit LS1, a threshold voltage $V_{th}$ for determining whether a signal current I is input, and thus can suppress erroneous detection caused by the fluctuations in bias current or the input offset of the comparator Com. Therefore, the detection accuracy of the signal current I can be further improved.

Figure 6:
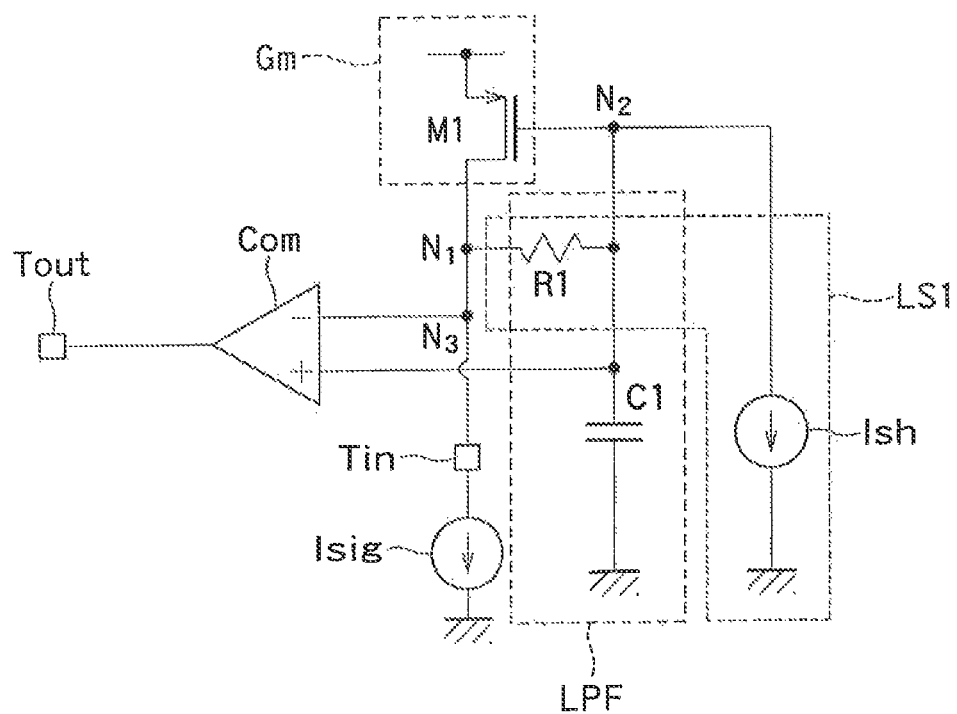
FIG. 6 is a circuit diagram showing an example of the current detection circuit of FIG. 5.

FIG. 6 is a circuit diagram showing an example of the current detection circuit according to the present embodiment. As shown in FIG. 6, the level shift circuit LS1 includes a resistance element R1 and a current source Ish. Configurations other than the current source Ish are the same as those of FIG. 3.

The current source Ish is grounded at its one end and connected to the node $N_2$ at its other end, and supplies a predetermined current Ish. The threshold voltage $V_{th}$ of the level shift circuit LS1 is $R1 \cdot Ish$.

In the current detection circuit of FIG. 6, since a filter LPF and the level shift circuit LS1 share the resistance element R1, the circuit size can be reduced. In addition, by adjusting the current Ish, the threshold voltage $V_{th}$ can be easily set to any value.

Figure 7:
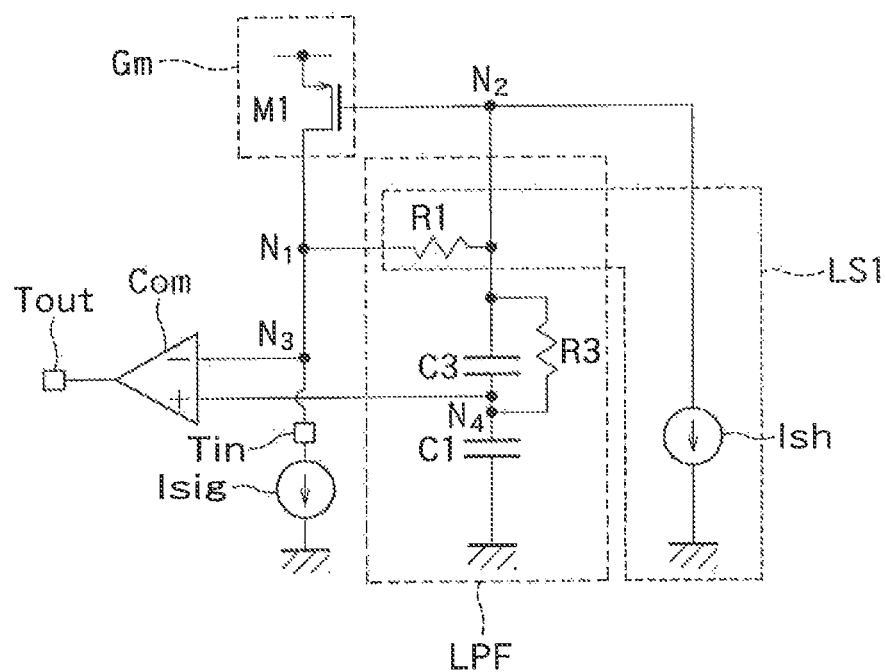
FIG. 7 is a circuit diagram showing another example of the current detection circuit of FIG. 5.

FIG. 7 is a circuit diagram showing another example of the current detection circuit according to the present embodiment. In the current detection circuit of FIG. 7, a filter LPF includes a capacitance element C1 (second capacitance element), a capacitance element C3 (first capacitance element), a resistance element R1, and a resistance element R3. Configurations other than the resistance element R3 and the capacitance element C3 are the same as those of FIG. 6.

The capacitance element C3 is connected in series with the capacitance element C1 between the resistance element R1 and the capacitance element C1. The resistance element R3 is connected in parallel to the capacitance element C3 between the resistance element R1 and the capacitance element C1. A positive input terminal of a comparator Com is connected to a connection point (node $N_4$) between the capacitance element C1 and the capacitance element C3 which are connected in series with each other. Namely, the filter LPF in the current detection circuit of FIG. 7 has an output terminal (node $N_2$) to a converter circuit Gm and an output terminal (node $N_4$) to the comparator Com.

By such a configuration, the low-frequency components of a voltage $V_2$ at the node $N_2$ are input to the positive input terminal of the comparator Com through the resistance element R3, and the high-frequency components of the voltage $V_2$ are voltage-divided by the capacitance element C1 and the capacitance element C3 and input to the positive input terminal of the comparator Com. Therefore, the alternating-current component contained in a reference voltage which is input to the positive input terminal of the comparator Com is reduced, enabling to further improve the detection accuracy of a signal current I.

Figure 8:
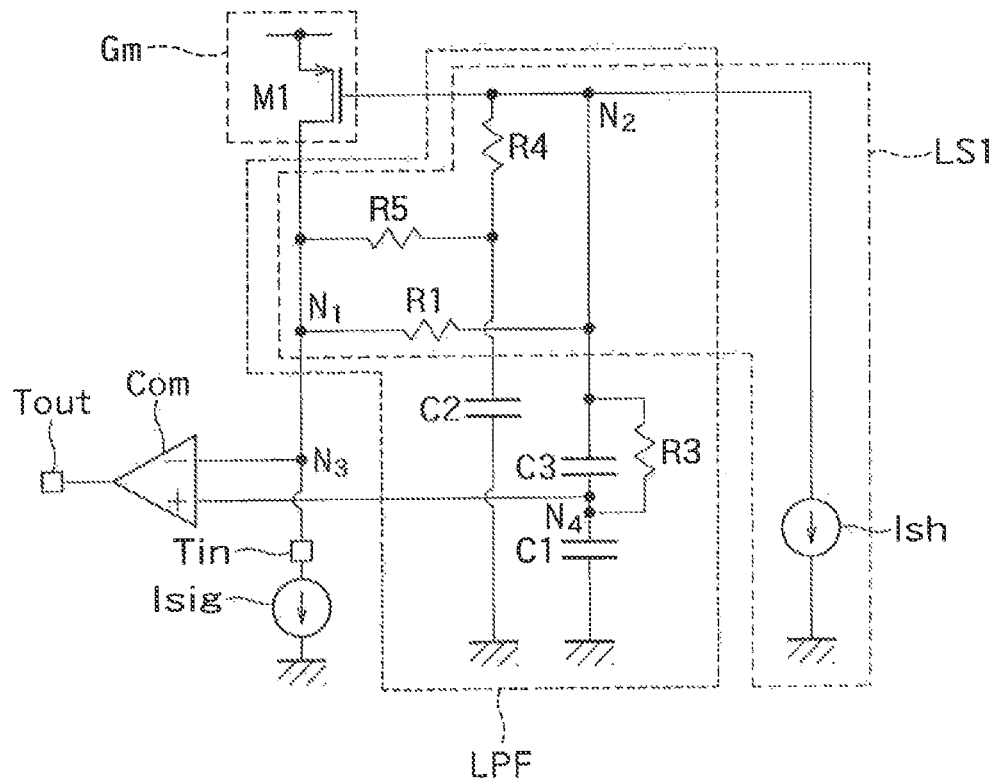
FIG. 8 is a circuit diagram showing still another example of the current detection circuit of FIG. 5.

When the filter LPF is a second-order filter, as shown in FIG. 8, the filter LPF is configured such that the positive input terminal of the comparator Com is connected to the connection point between the capacitance element C1 and the capacitance element C3 which are connected in series with each other.

(Third Embodiment)

Figure 9:
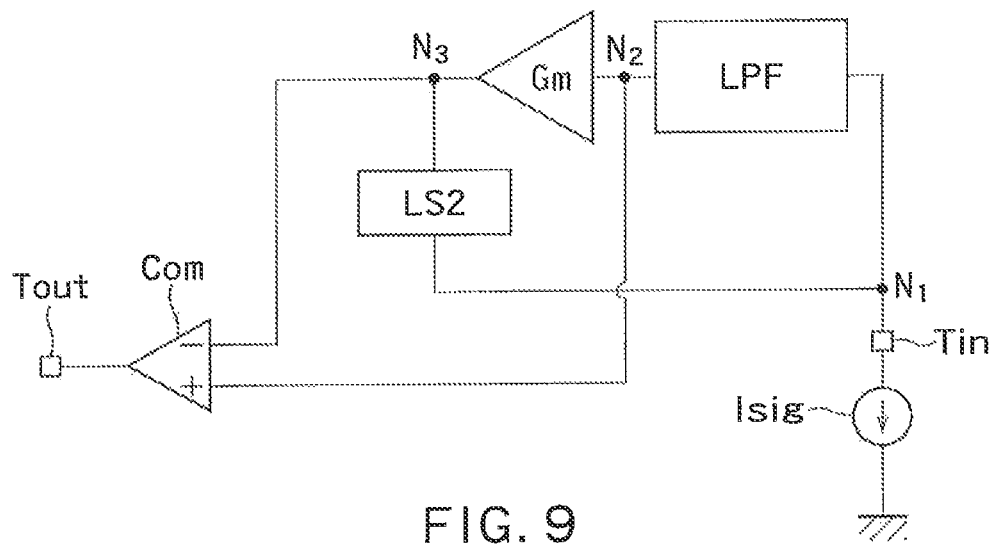
FIG. 9 is a schematic diagram showing a current detection circuit according to a third embodiment.

Next, a current detection circuit according to a third embodiment will be described with reference to FIGS. 9 and 10. FIG. 9 is a schematic diagram showing a current detection circuit according to the present embodiment. As shown in FIG. 9, the current detection circuit according to the present embodiment includes a level shift circuit LS2. Other configurations are the same as those of the first embodiment.

The level shift circuit LS2 is connected between a node $N_1$ and a node $N_3$, and increases a voltage $V_1$ at the node $N_1$ by a predetermined voltage $V_{th}$ and inputs the resulting voltage to a negative input terminal of a comparator Com. To the comparator Com is input $V_1+V_{th}$ as an input voltage and is input $V_2$ as a reference voltage.

The current detection circuit according to the present embodiment can arbitrarily set, by the level shift circuit LS2, a threshold voltage $V_{th}$ for determining whether a signal current I is input, and thus can suppress erroneous detection caused by the fluctuations in bias current or the input offset of the comparator Com. Therefore, the detection accuracy of the signal current I can be further improved.

Figure 10:
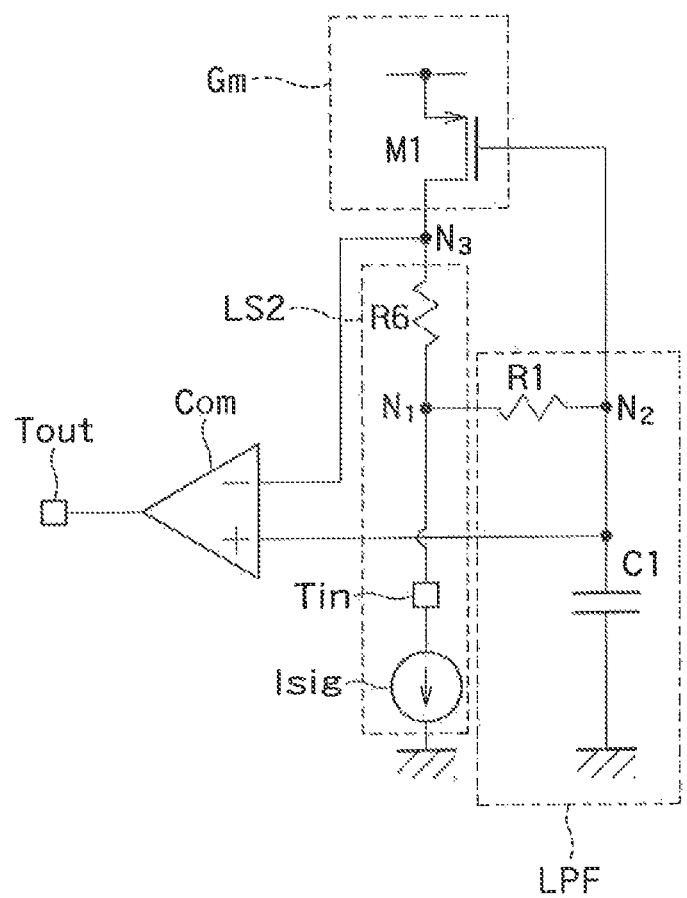
FIG. 10 is a circuit diagram showing an example of the current detection circuit of FIG. 9.

Here, FIG. 10 is a circuit diagram showing an example of the current detection circuit according to the present embodiment. As shown in FIG. 10, the level shift circuit LS2 is composed of a current source Isig and a resistance element R6. Configurations other than the resistance element R6 are the same as those of FIG. 3.

The resistance element R6 is connected between the node $N_1$ and the node $N_3$, and increases the voltage $V_1$ at the node $N_1$ by R6·I and inputs the resulting voltage to the negative input terminal of the comparator Com. Namely, the threshold voltage $V_{th}$ is R6·I.

In the current detection circuit of FIG. 10, since the level shift circuit LS2 is composed of the current source Isig and the resistance element R6, the circuit size can be reduced. In addition, by adjusting the resistance value R6 of the resistance element R6, the threshold voltage $V_{th}$ can be easily set to any value.

(Fourth Embodiment)

Figure 11:
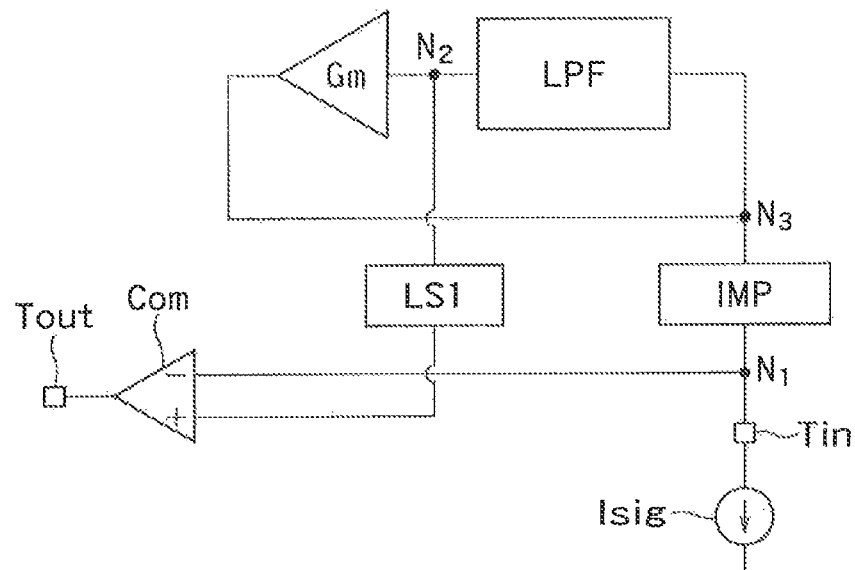
FIG. 11 is a schematic diagram showing a current detection circuit according to a fourth embodiment.

Next, a current detection circuit according to a fourth embodiment will be described with reference to FIGS. 11 and 12. FIG. 11 is a schematic diagram showing a current detection circuit according to the present embodiment. As shown in FIG. 11, the current detection circuit according to the present embodiment includes an impedance element IMP. Other configurations are the same as those of the second embodiment.

The impedance element IMP is connected between an input terminal Tin and a negative input terminal of a comparator Com, and an input terminal of a filter LPF and an output terminal of a converter circuit Gm. In the present embodiment, a connection point between the input terminal Tin and the impedance element IMP is referred to as a node $N_1$, and a connection point between the output terminal of the converter circuit Gm and the impedance element IMP is referred to as a node $N_3$. The impedance element IMP increases a voltage $V_1$ at the node $N_1$ by a voltage according to impedance and a signal current I, and inputs the resulting voltage to the filter LPF. By this, the voltage $V_1$ at the node $N_1$ decreases by a voltage $V_{th}$ according to the impedance and the signal current I.

The current detection circuit according to the present embodiment can minutely adjust the threshold voltage $V_{th}$ for determining whether a signal current I is input, by the impedance element IMP together with a voltage generated by a level shift circuit LS1. Thus, the current detection circuit can suppress erroneous detection caused by the fluctuations in bias current or the input offset of the comparator Com and can also adjust manufacturing variations in configurations. In addition, upon arrival of a signal, the signal can be converted to a larger voltage by the impedance element IMP. Therefore, the detection accuracy of the signal current I can be further improved.

Figure 12:
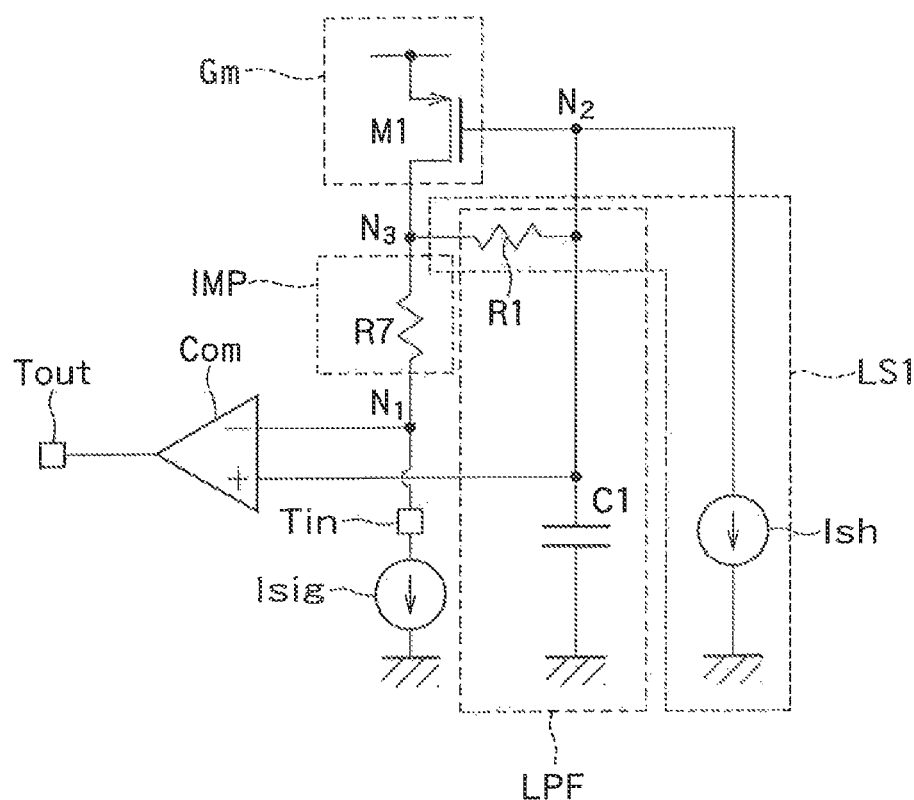
FIG. 12 is a circuit diagram showing an example of the current detection circuit of FIG. 11.

FIG. 12 is a circuit diagram showing an example of the current detection circuit according to the present embodiment. In the current detection circuit of FIG. 12, a resistance element R7 is used as the impedance element IMP. Configurations other than the resistance element R7 are the same as those of FIG. 6.

The resistance element R7 is connected between the node $N_1$ and the node $N_3$, and increases the voltage $V_1$ by R7·I and inputs the resulting voltage to the filter LPF. The current detection circuit can easily adjust the threshold voltage $V_{th}$ by changing the resistance value of the resistance element R7.

(Fifth Embodiment)

Figure 13:
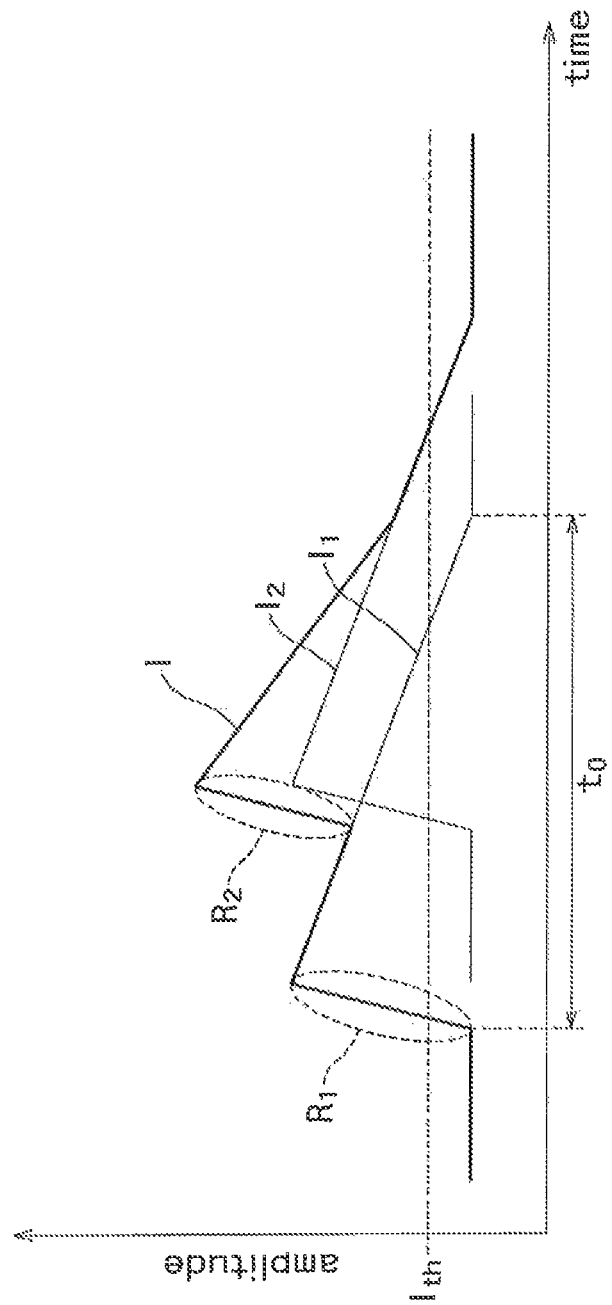
FIG. 13 is an illustrative diagram describing pile-up.

Next, a pile-up detection circuit according to a fifth embodiment will be described with reference to FIGS. 13 to 16. The pile-up detection circuit according to the present embodiment detects pile-up of a signal current. The pile-up refers to the superimposition of a plurality of signal currents as shown in FIG. 13. In FIG. 13, by two signal currents $I_1$ and $I_2$ piling up on each other, a signal current I indicated by a thick line is formed. In the following, each of the signal currents piling up in the signal current I is referred to as a signal current $I_i$ (i=1, 2, . . . ). When the signal current I does not have pile-up, the signal current I is the same as the signal current $I_i$.

Figure 14:
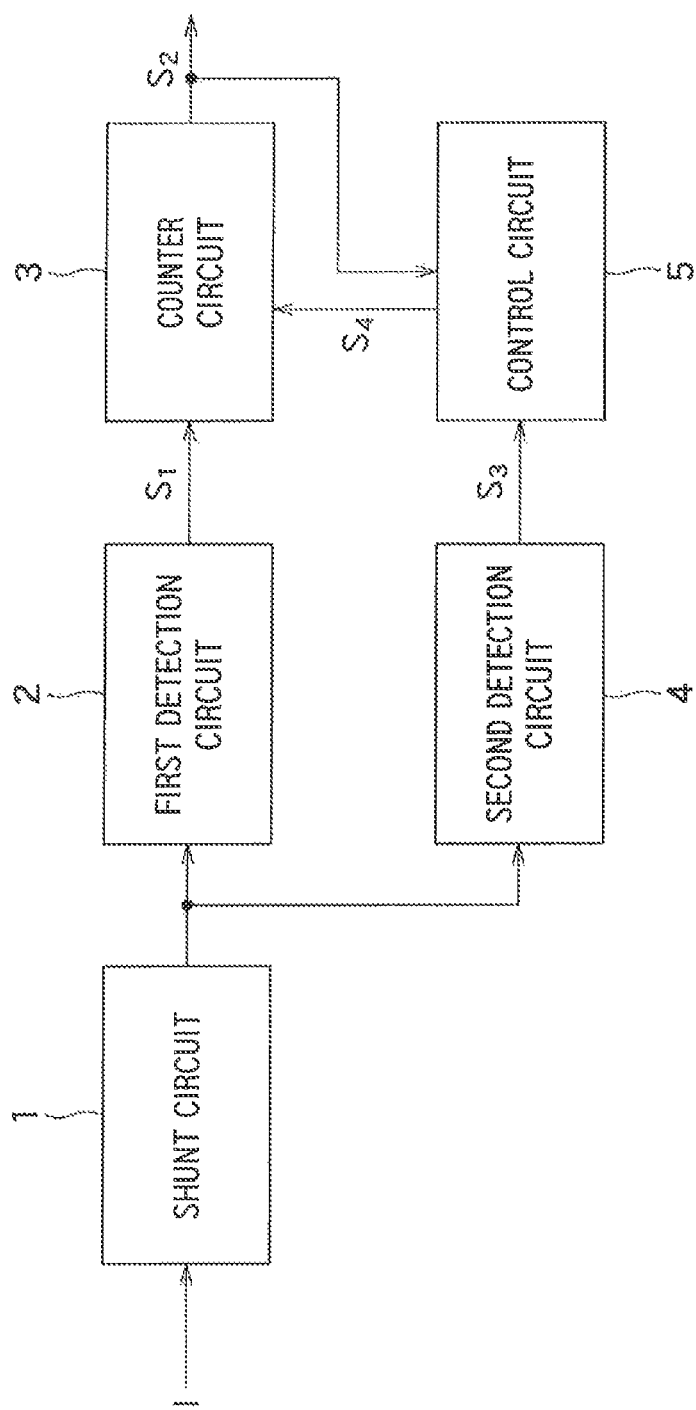
FIG. 14 is a schematic diagram showing a pile-up detection circuit according to a fifth embodiment.

Here, FIG. 14 is a schematic diagram showing an example of the pile-up detection circuit according to the present embodiment. As shown in FIG. 14, the pile-up detection circuit includes a shunt circuit 1, a first detection circuit 2, a counter circuit 3, a second detection circuit 4, and a control circuit 5.

A signal current I is input to the shunt circuit 1 from a signal source such as a current source Isig. The shunt circuit 1 shunts the signal current I at a predetermined ratio and inputs the shunted signal currents I to the first detection circuit 2 and the second detection circuit 4. Note that the pile-up detection circuit may include a duplicating circuit such as a current mirror circuit, instead of the shunt circuit 1.

To the first detection circuit 2 is input the shunted signal current I from the shunt circuit 1. The first detection circuit 2 detects a signal current $I_i$. When the first detection circuit 2 detects the signal current $I_i$, the first detection circuit 2 outputs a signal current detection signal $S_1$ (hereinafter, referred to as the "detection signal $S_1$"). The detection signal $S_1$ is input to the counter circuit 3.

To the counter circuit 3 is input the detection signal $S_1$ from the first detection circuit 2. The counter circuit 3 counts the number of input detection signals $S_1$, i.e., the number of signal currents $I_i$ detected by the first detection circuit 2. When the count value is 2, the counter circuit 3 resets its count value to 0 and outputs a pile-up detection signal $S_2$ (hereinafter, referred to as the "pile-up signal $S_2$"). The pile-up signal $S_2$ is a signal indicating that the pile-up detection circuit has detected pile-up. The pile-up signal $S_2$ is input to the control circuit 5. The control circuit 5 will be described later.

As described above, the first detection circuit 2 is to count the number of input signal currents $I_i$. Hence, when a signal current I having a plurality of pile-up signal currents $I_i$ is input to the first detection circuit 2, the first detection circuit 2 is required to detect each of the signal currents $I_i$.

For example, when the signal current I shown in FIG. 13 is input, the first detection circuit 2 needs to detect the signal currents $I_1$ and $I_2$. However, such detection is difficult for a conventional detection circuit that performs detection by comparing the signal current I with a predetermined threshold value $I_{th}$. This is because even if the threshold value $I_{th}$ is set as shown in FIG. 13, the signal current I exceeds the threshold value $I_{th}$ only once. Thus, the signal current $I_2$ piling up on the signal current $I_1$ later cannot be detected. In addition, since the timing at which the signal currents $I_i$ pile up and the number of pile-up signal currents $I_i$ are random, even if a plurality of threshold values $I_{th}$ are set, it is difficult to detect each of the signal currents $I_i$.

Hence, it is preferred that the first detection circuit 2 be any of the current detection circuits according to the above-described embodiments. As described above, what the current detection circuit detects is a rising portion R of the signal current I containing many high-frequency components. Therefore, according to the current detection circuit, even when a plurality of signal current I, pile up on each other, as shown in FIG. 13, rise portions $R_i$ of the respective signal currents $I_i$ can be detected. When the first detection circuit 2 is any of the above-described current detection circuits, the detection signal $S_1$ is an output signal from the comparator Com.

To the second detection circuit 4 is input the shunted signal current I from the shunt circuit 1. The second detection circuit 4 detects the signal current I. When the second detection circuit 4 detects the signal current I, the second detection circuit 4 outputs a signal current detection signal $S_3$ (hereinafter, referred to as the "detection signal $S_3$"). The detection signal $S_3$ is input to the control circuit 5.

To the control circuit 5 is input the detection signal $S_3$ from the second detection circuit 4. The control circuit 5 outputs a reset signal $S_4$ after a lapse of a predetermined period of time $t_1$ from the input of the detection signal $S_3$, i.e., after a lapse of the predetermined period of time $t_1$ from the detection of the signal current I by the second detection circuit 4. The reset signal $S_4$ is input to the counter circuit 3 to reset the count value of the counter circuit 3 to 0. By resetting the count value to 0 by the reset signal $S_4$, erroneous operation can be prevented.

As shown in FIG. 13, the predetermined period of time $t_1$ is set according to a signal duration $t_o$ assumed for each of the signal currents $I_i$. After the control circuit 5 outputs the reset signal $S_4$, the control circuit 5 is reset to its initial state. The initial state mentioned here refers to a state of waiting for an input of a detection signal $S_3$ from the second detection circuit 4.

In addition, the pile-up signal $S_2$ is input to the control circuit 5 from the counter circuit 3. When the pile-up signal $S_2$ is input, too, the control circuit 5 is reset to its initial state.

As described above, the second detection circuit 4 is to set the timing at which measurement of a predetermined period of time $t_1$ starts. Therefore, since the second detection circuit 4 only needs to detect the input of a signal current I, unlike the first detection circuit 2 the second detection circuit 4 is not required to detect each of a plurality of signal currents $I_i$ piling up in the signal current I. Hence, as the second detection circuit 4, any circuit capable of detecting the input of a signal current I can be used. The second detection circuit 4 may be any of the current detection circuits according to the above-described embodiments.

Figure 15:
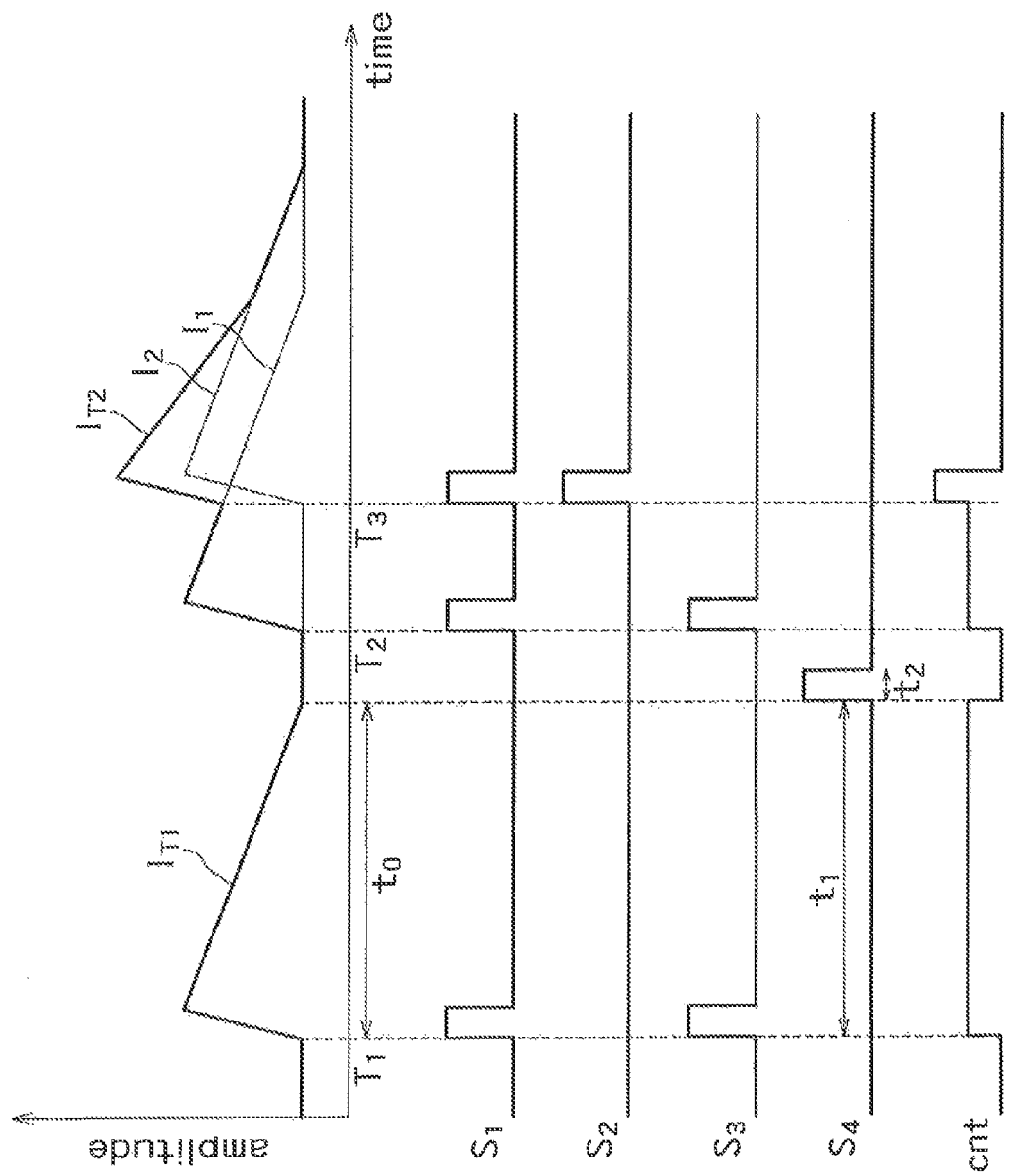
FIG. 15 is a timing chart showing the operation of the pile-up detection circuit according to the fifth embodiment.

Next, the operation of the pile-up detection circuit according to the present embodiment will be described with reference to FIG. 15. FIG. 15 is a timing chart showing the operation of the pile-up detection circuit. In the following description it is assumed that $t_0=t_1$, a signal current $I_{T1}$ is input at time $T_1$, and a signal current $I_{T2}$ is input at time $T_2$. Note that the signal current $I_{T1}$ does not have pile-up and the signal current $I_{T2}$ has pile-up signal currents $I_1$ and $I_2$.

When the signal current $I_{T1}$ is input at time $T_1$, the first detection circuit 2 detects the signal current $I_{T1}$ and inputs a detection signal $S_1$ to the counter circuit 3. By this, the count value cnt of the counter circuit 3 becomes 1.

In addition, the second detection circuit 4 detects the signal current and inputs a detection signal $S_3$ to the control circuit 5. By this, the control circuit 5 starts measurement of a predetermined period of time $t_1$.

Thereafter, when the predetermined period of time $t_1$ has elapsed from time $T_1$, the control circuit 5 inputs a reset signal $S_4$ to the counter circuit 3. By this, the count value cnt is reset to 0. In addition, the control circuit 5 is reset to its initial state.

Then, when the signal current $I_{T2}$ is input at time $T_2$, the first detection circuit 2 detects the signal current $I_{T2}$ and inputs a detection signal $S_1$ to the counter circuit 3. By this, the count value cnt of the counter circuit 3 becomes 1.

In addition, the second detection circuit 4 detects the signal current $I_{T2}$ and inputs a detection signal $S_3$ to the control circuit 5. By this, the control circuit 5 starts measurement of a predetermined period of time $t_1$.

Thereafter, when the first detection circuit 2 detects the pile-up signal current $I_2$ at time $T_3$, the first detection circuit 2 inputs a detection signal $S_1$ again to the counter circuit 3. By this, the count value cnt of the counter circuit 3 becomes 2.

When the count value cnt becomes 2, the counter circuit 3 outputs a pile-up signal $S_2$. By this, pile-up is detected. In addition, the counter circuit 3 resets the count value cnt to 0.

Then, the pile-up signal $S_2$ output from the counter circuit 3 is input to the control circuit 5. By this, the control circuit 5 ends the measurement of the predetermined period of time $t_1$ and is reset to its initial state.

As described above, according to the pile-up detection circuit according to the present embodiment, pile-up can be detected by counting the number of signal currents $I_i$, using the first detection circuit 2 that detects the rises of the signal currents $I_i$.

There is a conventional pile-up detection circuit that detects a signal current I using a threshold value $I_{th}$ and detects pile-up when the detection period continues for a predetermined period of time or more. In such a pile-up detection circuit, pile-up detection accuracy may decrease due to the degradation over time of a circuit that detects a signal current or a change in the low-frequency components of the signal current I.

However, in the pile-up detection circuit according to the present embodiment, by using any of the current detection circuits according to the above-described embodiments as the first detection circuit 2, a reduction in pile-up detection accuracy due to the degradation over time of a circuit that detects a signal current or a change in the low-frequency components of the signal current I can be suppressed.

Figure 16:
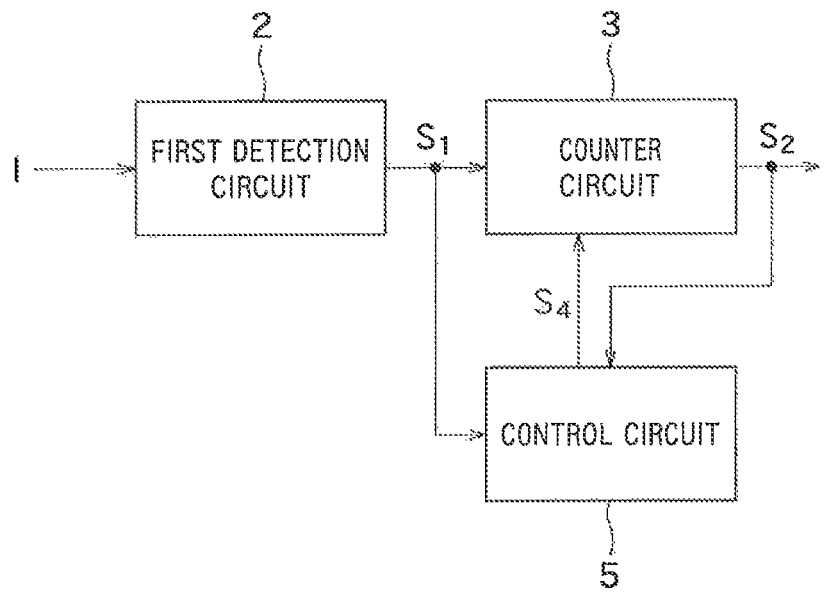
FIG. 16 is a schematic diagram showing another example of the pile-up detection circuit according to the fifth embodiment.

Note that in the pile-up detection circuit according to the present embodiment, as shown in FIG. 16, the first detection circuit 2 and the second detection circuit 4 may be used in a shared manner. Specifically, the first detection circuit 2 may be used as the second detection circuit 4. In this case, instead of a detection signal $S_3$, a detection signal $S_1$ is input to the control circuit 5. By such a configuration, the shunt circuit 1 and the second detection circuit 4 become unnecessary, enabling to simplify the circuit configuration.

(Sixth Embodiment)

Figure 17:
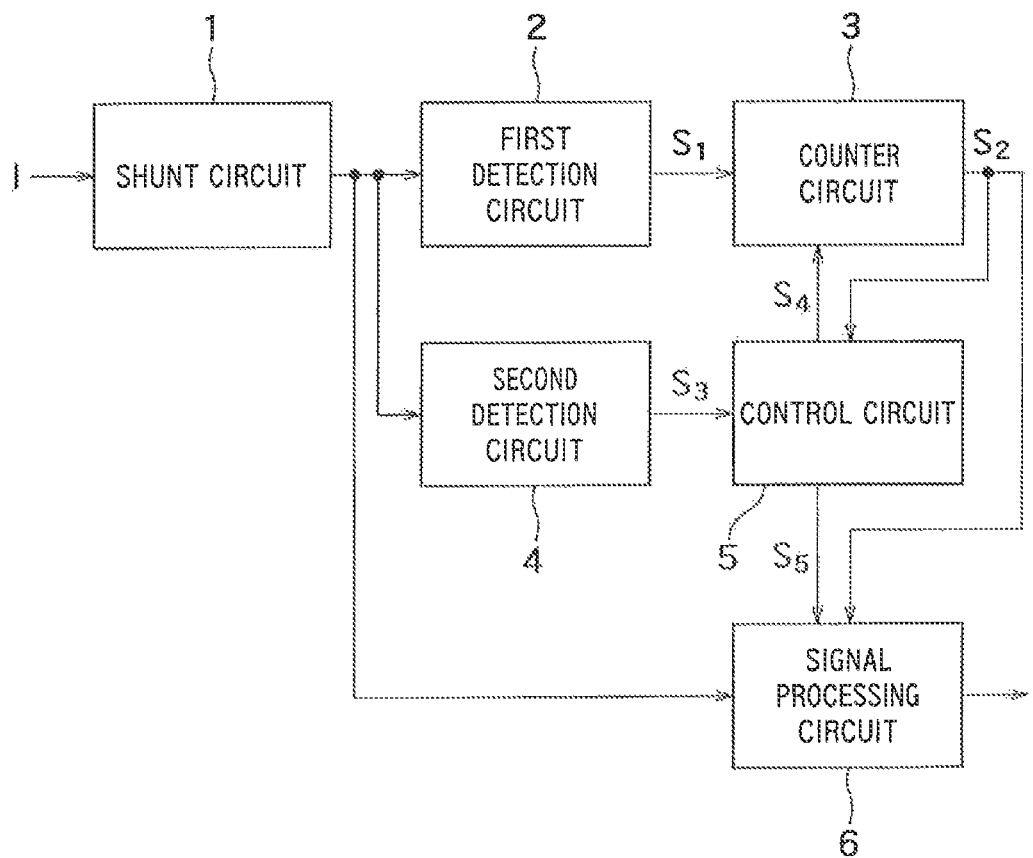
FIG. 17 is a schematic diagram showing a pile-up detection circuit according to a sixth embodiment.

Next, a pile-up detection circuit according to a sixth embodiment will be described with reference to FIGS. 17 to 20. Here, FIG. 17 is a schematic diagram showing an example of a pile-up detection circuit according to the present embodiment. As shown in FIG. 17, the pile-up detection circuit further includes a signal processing circuit 6. Other configurations are the same as those of the fifth embodiment.

A signal current I shunted by a shunt circuit 1 is input to the signal processing circuit 6. The signal processing circuit 6 performs predetermined signal processing on the signal current I. The signal processing includes any signal processing such as integration and differentiation of the signal current I.

A start signal $S_5$ is input to the signal processing circuit 6 from a control circuit 5. When the start signal $S_5$ is input to the signal processing circuit 6, the signal processing circuit 6 starts signal processing on the signal current I and continues the signal processing while the start signal $S_5$ is input. When a detection signal $S_3$ is input to the control circuit 5 from a second detection circuit 4, the control circuit 5 starts measurement of a predetermined period of time $t_1$ and inputs a start signal $S_5$ to the signal processing circuit 6. Then, when the predetermined period of time $t_1$ has elapsed, the control circuit 5 inputs a reset signal $S_4$ to a counter circuit 3 and terminates the input of the start signal $S_5$ to the signal processing circuit 6.

In addition, a pile-up signal $S_2$ is input to the signal processing circuit 6 from the counter circuit 3. When the pile-up signal $S_2$ is input, the signal processing circuit 6 ends the signal processing and resets an output signal generated by the signal processing. For example, when the signal processing is integration, the integral value is reset. Note that when the pile-up signal $S_2$ is not input to the signal processing circuit 6, the signal processing circuit 6 ends the signal processing at timing at which the input of the start signal $S_5$ is terminated.

Figure 18:
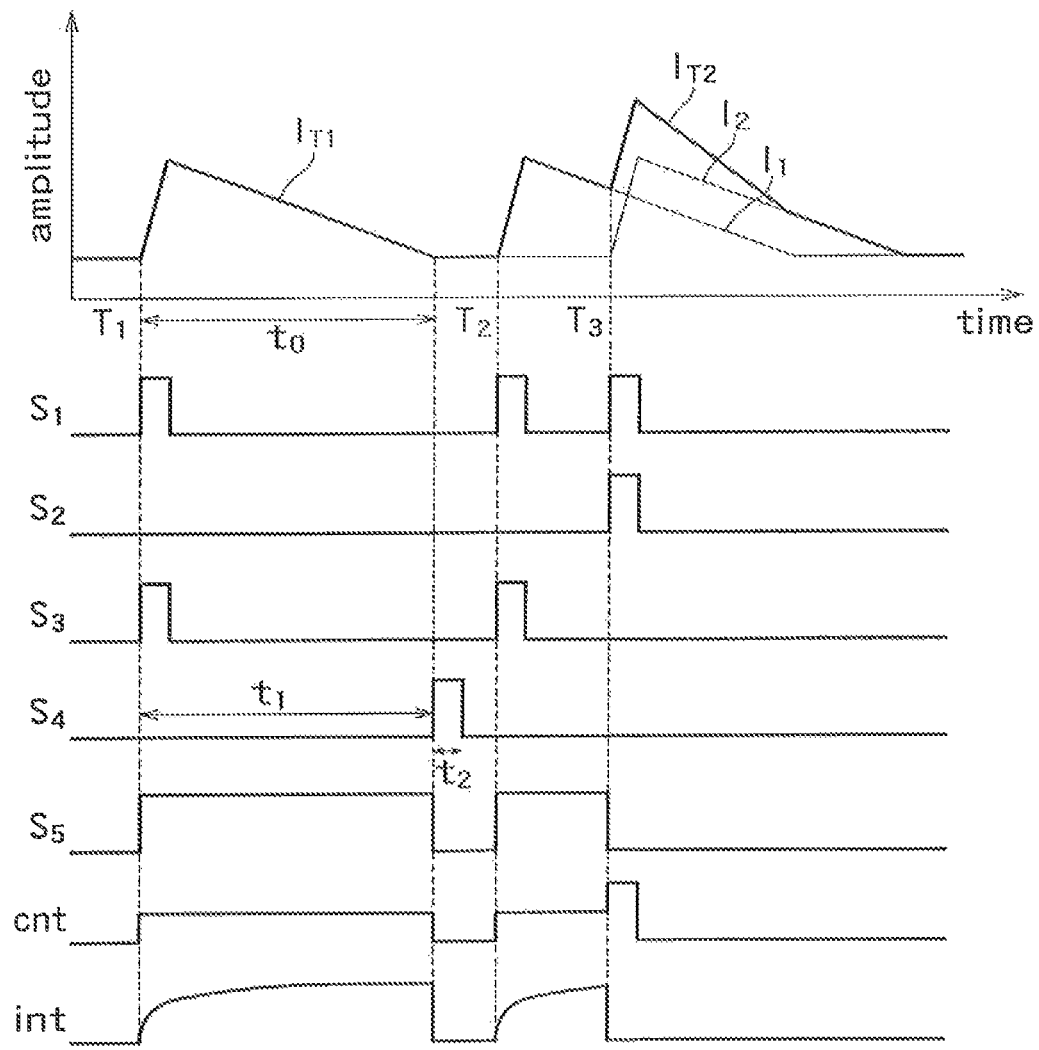
FIG. 18 is a timing chart showing the operation of the pile-up detection circuit according to the sixth embodiment.

Next, the operation of the pile-up detection circuit according to the present embodiment will be described with reference to FIG. 18. FIG. 18 is a timing chart showing the operation of the pile-up detection circuit. It is assumed that the signal processing performed by the signal processing circuit 6 is the integration of a signal current I.

When a signal current $I_{T1}$ is input at time $T_1$, a first detection circuit 2 detects the signal current $I_{T1}$ and inputs a detection signal $S_1$ to the counter circuit 3. By this, the count value cnt of the counter circuit 3 becomes 1.

In addition, the second detection circuit 4 detects the signal current $I_{T1}$ and inputs a detection signal $S_3$ to the control circuit 5. By this, the control circuit 5 starts measurement of a predetermined period of time $t_1$ and inputs a start signal $S_5$ to the signal processing circuit 6. When the start signal $S_5$ is input, the signal processing circuit 6 starts integration of the signal current $I_{T1}$, by which an integral value int increases.

Thereafter, when the predetermined period of time $t_1$ has elapsed from time $T_1$, the control circuit 5 inputs a reset signal $S_4$ to the counter circuit 3. By this, the count value cnt is reset to 0. Then, the control circuit 5 is reset to its initial state. In addition, the input of the start signal $S_5$ is terminated and the signal processing circuit 6 terminates the integration of the signal current $I_{T1}$. The signal processing circuit 6 outputs the integral value int and resets the integral value int.

When a signal current $I_{12}$ is input at time $T_2$, the first detection circuit 2 detects the signal current $I_{T2}$ and inputs a detection signal $S_1$ to the counter circuit 3. By this, the count value cnt of the counter circuit 3 becomes 1.

In addition, the second detection circuit 4 detects the signal current $I_{T2}$ and inputs a detection signal $S_3$ to the control circuit 5. By this, the control circuit 5 starts measurement of a predetermined period of time $t_1$ and inputs a start signal $S_5$ to the signal processing circuit 6. When the start signal $S_5$ is input, the signal processing circuit 6 starts integration of the signal current $I_{T2}$, by which the integral value int increases.

Thereafter, when the first detection circuit 2 detects a pile-up signal current $I_2$ at time $T_3$, the first detection circuit 2 inputs a detection signal $S_1$ again to the counter circuit 3. By this, the count value cnt of the counter circuit 3 becomes 2.

When the count value cnt becomes 2, the counter circuit 3 outputs a pile-up signal $S_2$. By this, pile-up is detected. In addition, the counter circuit 3 resets the count value cnt to 0.

Then, the pile-up signal $S_2$ output from the counter circuit 3 is input to the control circuit 5. By this, the control circuit 5 ends the measurement of the predetermined period of time $t_1$ and is reset to its initial state.

In the present embodiment, the pile-up signal $S_2$ is also input to the signal processing circuit 6. By this, the signal processing circuit 6 terminates the integration of the signal current $I_{T2}$. At this time, the integral value int is reset without being output.

As described above, according to the pile-up detection circuit according to the present embodiment, when pile-up is detected, signal processing performed by the signal processing circuit 6 ends and an output signal is reset. Therefore, the signal processing circuit 6 can perform signal processing, excluding a pile-up signal current I.

Figure 19:
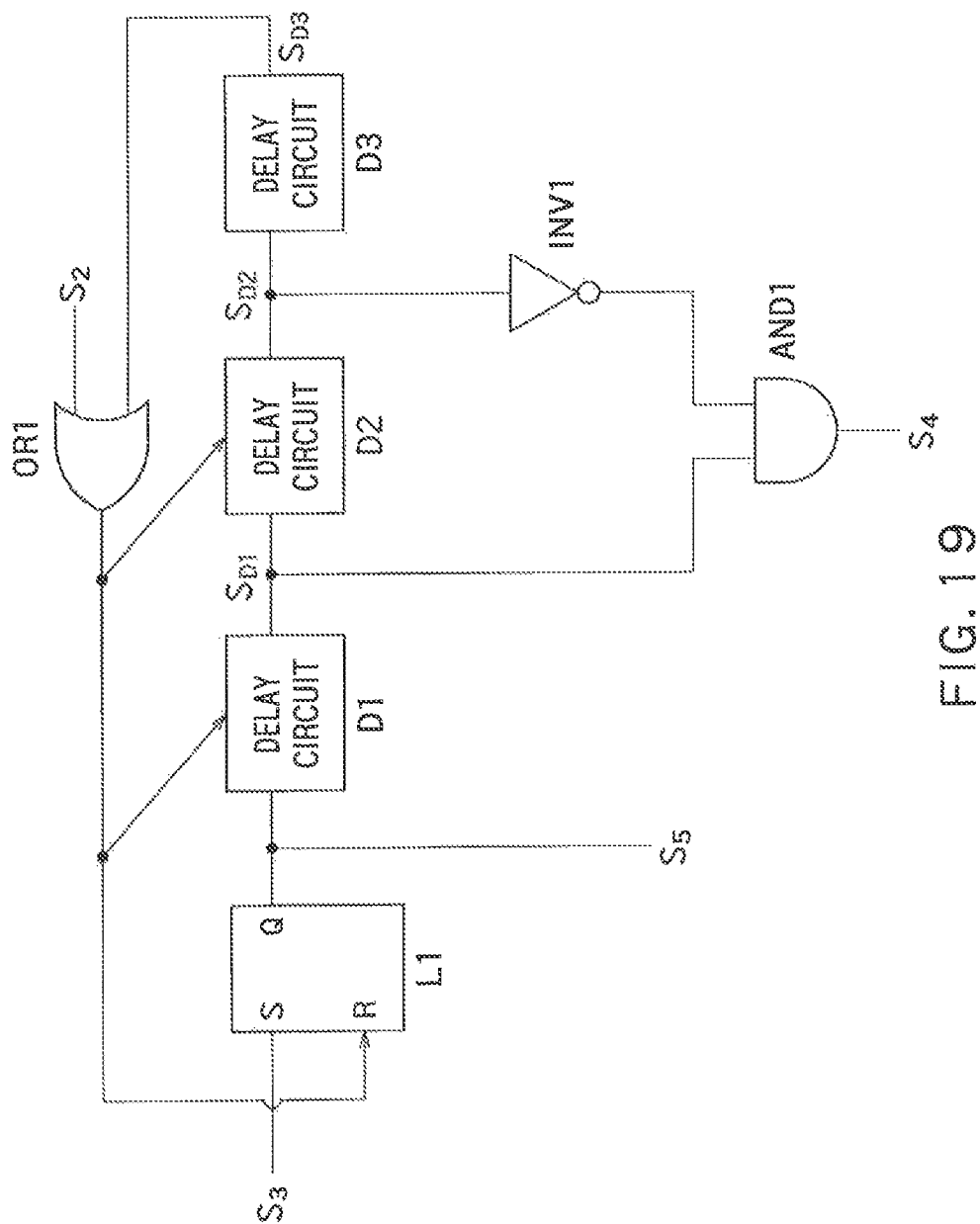
FIG. 19 is a circuit diagram showing an example of a control circuit.

Here, FIG. 19 is a circuit diagram showing an example of the control circuit 5. The control circuit 5 of FIG. 19 includes a flip-flop circuit L1, delay circuits D1 to D3, an OR circuit OR1, an inverter circuit INV1, and an AND circuit AND1.

The flip-flop circuit L1 is an RS flip-flop circuit having an R (reset) terminal and an S (set) terminal. To the flip-flop circuit L1 is input a detection signal $S_3$ through the S terminal and is input an output signal from the OR circuit OR1 through the R terminal. An output signal from the flip-flop circuit L1 is input as a start signal $S_5$ to the signal processing circuit 6.

The start signal $S_5$ is input to the delay circuit D1 from the flip-flop circuit L1. The delay circuit D1 outputs a delay signal $S_{D1}$ obtained by delaying the start signal $S_5$ by a predetermined delay time. The delay time of the delay circuit D1 is the above-described predetermined period of time $t_1$. The delay signal $S_{D1}$ is input to the delay circuit D2 and the AND circuit AND1.

To the delay circuit D2 is input the delay signal $S_{D1}$ from the delay circuit D1. The delay circuit D2 outputs a delay signal $S_{D2}$ obtained by delaying the delay signal $S_{D1}$ by a predetermined delay time. The delay time of the delay circuit D2 is a pulse width $t_2$ of a reset signal $S_4$. The delay signal $S_{D2}$ is input to the delay circuit D3 and the inverter circuit INV1.

To the delay circuit D3 is input the delay signal $S_{D2}$ from the delay circuit D2. The delay circuit D3 outputs a delay signal $S_{D3}$ obtained by delaying the delay signal $S_{D2}$ by a predetermined delay time. By the delay circuit D3 delaying the signal, the output timing of the OR circuit OR1 can be adjusted. Note that a configuration not including the delay circuit D3 is also possible. The delay signal $S_{D3}$ is input to the OR circuit OR1.

To the OR circuit OR1 (first OR circuit) is input a pile-up signal $S_2$ from the counter circuit 3 and is input the delay signal $S_{D3}$ from the delay circuit D3. The OR circuit OR1 outputs the logical OR of the input signals. The output signal from the OR circuit OR1 is input to the R terminal of the flip-flop circuit L1 to reset the output signal (start signal $S_5$) from the flip-flop circuit L1. Namely, the input of the start signal $S_5$ to the signal processing circuit 6 is terminated. In addition, the output signal from the OR circuit OR1 is input to the delay circuits D1 and D2 to end the delay processes performed by the delay circuits D1 and D2.

To the inverter circuit INV1 is input the delay signal $S_{D2}$ from the delay circuit D2. The inverter circuit INV1 inverts the delay signal $S_{D2}$ and outputs the inverted signal. The output signal from the inverter circuit INV1 is input to the AND circuit AND1.

To the AND circuit AND1 is input the delay signal $S_{D1}$ from the delay circuit D1 and is input the inverted delay signal $S_{D2}$ from the inverter circuit INV1. The AND circuit AND1 outputs the logical AND of the input signals. The output signal from the AND circuit AND1 is input as the reset signal $S_4$ to the counter circuit 3.

By a configuration such as that described above, the control circuit 5 can implement operation such as that described above. Note that in the timing charts shown in FIGS. 15 and 18, the delay time of the delay circuit D3 is 0.

Figure 20:
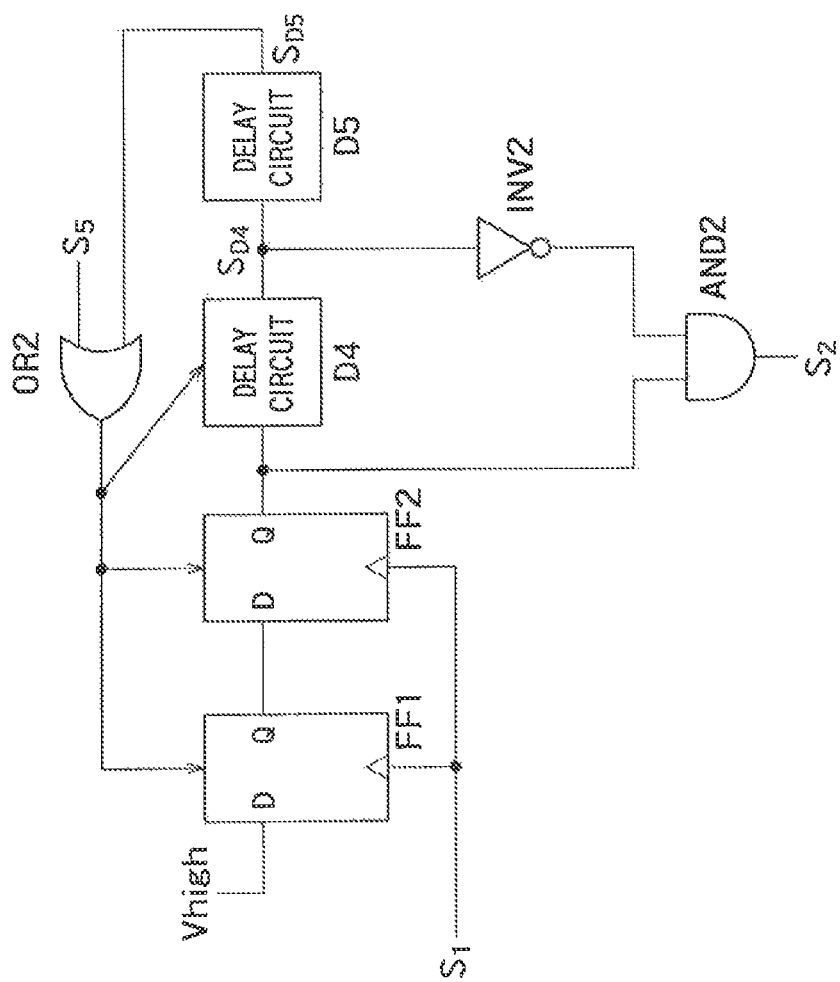
FIG. 20 is a circuit diagram showing an example of a counter circuit.

FIG. 20 is a circuit diagram showing an example of the counter circuit 3. The counter circuit 3 of FIG. 20 includes flip-flop circuits FF1 and FF2, delay circuits D4 and D5, an OR circuit OR2, an inverter circuit INV2, and an AND circuit AND2.

The flip-flop circuit FF1 (first D flip-flop circuit) is a D flip-flop circuit having a D terminal (input terminal) and a clock terminal. To the flip-flop circuit FF1 is input a predetermined signal Vhigh through the D terminal and is input a detection signal $S_1$ through the clock terminal. The signal Vhigh input through the D terminal is a signal according to a logical 1. Therefore, when the detection signal $S_1$ is input to the flip-flop circuit FF1, an output signal from the flip-flop circuit FF1 is a signal according to a logical 1. The output signal from the flip-flop circuit FF1 is input to the flip-flop circuit FF2.

The flip-flop circuit FF2 (second D flip-flop circuit) is a D flip-flop circuit having a D terminal (input terminal) and a clock terminal. To the flip-flop circuit FF2 is input the output signal from the flip-flop circuit FF1 through the D terminal and is input the detection signal $S_1$ through the clock terminal. Therefore, when the detection signal $S_1$ is input to the flip-flop circuit FF2 with the output signal from the flip-flop circuit FF1 being a signal according to a logical 1, an output signal from the flip-flop circuit FF2 is a signal according to a logical 1. The output signal from the flip-flop circuit FF2 is input to the delay circuit D4 and the AND circuit AND2.

The count value of the counter circuit 3 is stored as the output signals from the flip-flop circuits FF1 and FF2. For example, when the count value is 0, a detection signal $S_1$ is not input. Thus, the output signals from the flip-flop circuits FF1 and FF2 are both signals according to a logical 0.

When the count value is 1, a detection signal $S_1$ is input only once. Thus, the output signal from the flip-flop circuit FF1 is a signal according to a logical 1. At this time, the detection signal $S_1$ is also input to the flip-flop circuit FF2. However, since the output signal from the flip-flop circuit FF1 at the time point when the detection signal $S_1$ is input is a signal according to a logical 0, the output signal from the flip-flop circuit FF2 is still a signal according to a logical 0.

When the count value is 2, the second detection signal $S_1$ is input to the flip-flop circuits FF1 and FF2. Since the output signal from the flip-flop circuit FF1 at the time point when the second detection signal $S_1$ is input is a signal according to a logical 1, the output signal from the flip-flop circuit FF2 is a signal according to a logical 1. Therefore, the output signal from the flip-flop circuit FF2 is a signal according to the count value "2".

A signal according to the count value "2" is input to the delay circuit D4 from the flip-flop circuit FF2. The delay circuit D4 outputs a delay signal $S_{D4}$ obtained by delaying the signal by a predetermined delay time. The delay time of the delay circuit D4 is the pulse width of a pile-up signal $S_2$. The delay signal $S_{D4}$ is input to the delay circuit D5 and the inverter circuit INV2.

To the delay circuit D5 is input the delay signal $S_{D4}$ from the delay circuit D4. The delay circuit D5 outputs a delay signal $S_{D5}$ obtained by delaying the delay signal $S_{D4}$ by a predetermined delay time. By the delay circuit D5 delaying the signal, the output timing of the OR circuit OR2 can be adjusted. Note that a configuration not including the delay circuit D5 is also possible. The delay signal $S_{D5}$ is input to the OR circuit OR2.

To the OR circuit OR2 is input a start signal $S_5$ from the control circuit 5 and is input the delay signal $S_{D5}$ from the delay circuit D5. The OR circuit OR2 outputs the logical OR of the input signals. The output signal from the OR circuit OR2 is input to the flip-flop circuits FF1 and FF2 to reset the output signals from the flip-flop circuits FF1 and FF2. Namely, both of the output signals from the flip-flop circuits FF1 and FF2 are set to be signals according to a logical 0. In addition, the output signal from the OR circuit OR2 is input to the delay circuit D4 to end the delay process performed by the delay circuit D4.

To the inverter circuit INV2 is input the delay signal $S_{D4}$ from the delay circuit D4. The inverter circuit INV2 inverts the delay signal $S_{D4}$ and outputs the inverted signal. The output signal from the inverter circuit INV2 is input to the AND circuit AND2.

To the AND circuit AND2 is input the signal according to the count value "2" from the flip-flop circuit FF2 and is input the inverted delay signal $SD_4$ from the inverter circuit INV2. The AND circuit AND2 outputs the logical AND of the input signals. The output signal from the AND circuit AND2 is input as the pile-up signal $S_2$ to the control circuit 5 and the signal processing circuit 6.

By a configuration such as that described above, the counter circuit 3 can implement operation such as that described above. Note that in the timing charts shown in FIGS. 15 and 18, the delay time of the delay circuit D5 is 0.

Figure 21:
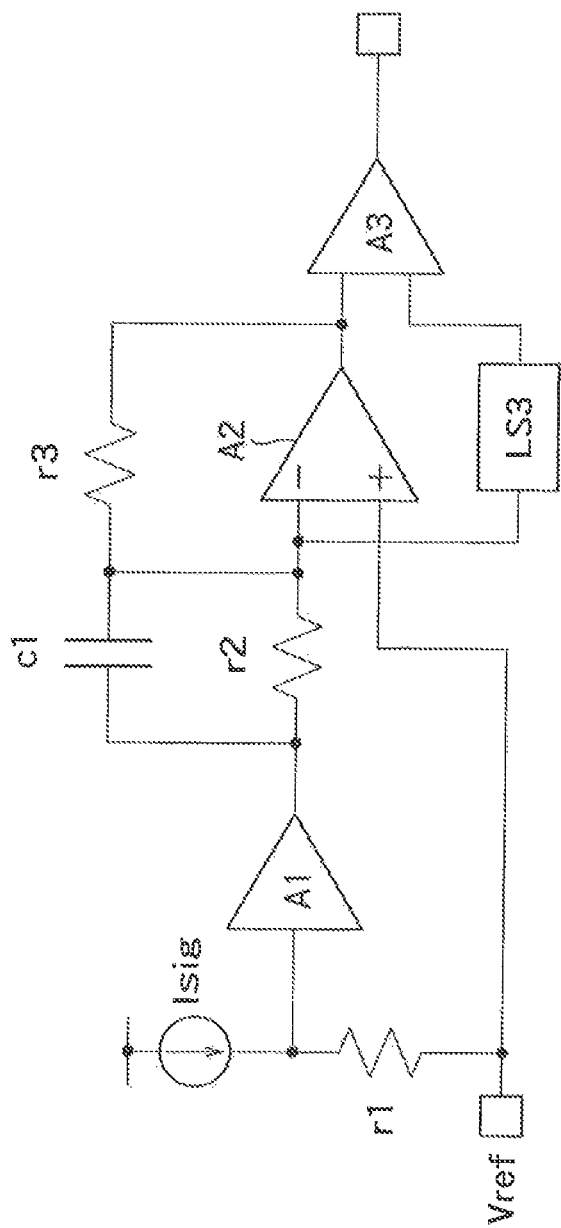
FIG. 21 is a circuit diagram showing another example of a first detection circuit.

Note that in the fifth and sixth embodiments the first detection circuit 2 is any of the current detection circuits according to the above-described embodiments, but is not limited thereto. FIG. 21 is a circuit diagram showing another example of the first detection circuit 2. As shown in FIG. 21, the first detection circuit 2 includes resistance elements r1 to r3, amplifiers A1 to A3, a capacitance element c1, and a level shift circuit LS3.

A signal current I input from a current source Isig is converted by the resistance element r1 to a voltage. The converted voltage is input to a subsequent stage through the amplifier A1. The amplifier A1 is a buffer. The output from the amplifier A1 is input to one terminal of the amplifier A3 through the resistance element r2, the capacitance element c1, the resistance element r3, and the amplifier A2. The resistance element r2 and the capacitance element c1 are connected in parallel to each other. The resistance element r3 is connected between the output and negative input terminal of the amplifier A2. The capacitance element c1, the resistance element r3, and the amplifier A2 form a differentiating circuit. By such a configuration, a signal in which the high-frequency components of the signal current I which are emphasized is input to one terminal of the amplifier A3. Here, the output voltage of the amplifier A2 is formed on the basis of the voltage at the negative input terminal of the amplifier A2.

In addition, the voltage at the negative input terminal of the amplifier A2 is input to the other terminal of the amplifier A3 through the level shift circuit LS3. Namely, a threshold voltage $V_{th}$ for determining whether a signal current I is input can be set by the level shift circuit LS3.

Therefore, according to the first detection circuit 2 of FIG. 21, as with the current detection circuits according to the first to fourth embodiments, a rise of the signal current I can be detected. By using this first detection circuit 2, pile-up detection circuits according to the fifth and sixth embodiments can be formed.

While certain embodiments have been described, these embodiments have been presented by way of example only, and are not intended to limit the scope of the inventions Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A current detection circuit comprising:
a low-pass filter, that a signal current is input, having a first terminal connected to a signal input terminal to which the signal current is input;
a voltage-to-current converter circuit, that an output signal of the low-pass filter is input, having a first terminal connected to a second terminal of the low-pass filter and having a second terminal connected to the signal input terminal; and
a comparator, that the output signal of the low-pass filter and an output signal of the voltage-to-current converter circuit are input, having a first input terminal and a second input terminal and outputting a signal according to a difference between a signal input through the first input terminal and a signal input through the second input terminal, the first input terminal being connected to the second terminal of the low-pass filter, and the second input terminal being connected to the second terminal of the voltage-to-current converter circuit,
wherein a level shift circuit is connected between the second terminal of the low-pass filter and the first input terminal of the comparator.

2. A current detection circuit comprising:
a low-pass filter, that a signal current is input, having a first terminal connected to a signal input terminal to which the signal current is input;
a voltage-to-current converter circuit, that an output signal of the low-pass filter is input, having a first terminal connected to a second terminal of the low-pass filter and having a second terminal connected to the signal input terminal; and
a comparator, that the output signal of the low-pass filter and an output signal of the voltage-to-current converter circuit are input, having a first input terminal and a second input terminal and outputting a signal according to a difference between a signal input through the first input terminal and a signal input through the second input terminal, the first input terminal being connected to the second terminal of the low-pass filter, and the second input terminal being connected to the second terminal of the voltage-to-current converter circuit,
wherein a level shift circuit is connected between the second terminal of the voltage-to-current converter circuit and the signal input terminal.

3. A current detection circuit comprising:
a low-pass filter, that a signal current is input, having a first terminal connected to a signal input terminal to which the signal current is input;
a voltage-to-current converter circuit, that an output signal of the low-pass filter is input, having a first terminal connected to a second terminal of the low-pass filter and having a second terminal connected to the signal input terminal; and
a comparator, that the input signal of the low-pass filter and an output signal of the voltage-to-current converter circuit are input, having a first input terminal and a second input terminal and outputting a signal according to a difference between a signal input through the first input terminal and a signal input through the second input terminal, the first input terminal being connected to the second terminal of the low-pass filter, and the second input terminal being connected to the second terminal of the voltage-to-current converter circuit,
wherein the low-pass filter includes: a first capacitance element connected to the first terminal of the voltage-to-current converter circuit; a second capacitance element connected in series with the first capacitance element; and a first resistance element connected in parallel to the first capacitance element, and
the first input terminal of the comparator is connected to a connection point between the first capacitance element and the second capacitance element.

4. A current detection circuit comprising:
a low-pass filter;
an impedance element having a first terminal connected to an input terminal of the low-pass filter and a second terminal connected to a signal input terminal to which a signal current is input;
a voltage-to-current converter circuit having an input terminal connected to an output terminal of the low-pass filter and having an output terminal connected to the first terminal of the impedance element; and
a comparator having a first input terminal and a second input terminal and outputting a signal according to a difference between a signal input through the first input terminal and a signal input through the second terminal, the first input terminal being input with a signal relating to an output signal of the low-pass filter, and the second input terminal being connected to the second terminal of the impedance element and the signal input terminal.

5. A pile-up detection circuit comprising:
a first detection circuit to detect a signal current;
a counter circuit to count a number of signal currents detected by the first detection circuit, and output a pile-up detection signal when a count value becomes 2;
a second detection circuit to detect the signal current; and
a control circuit to reset the count value of the counter circuit after a lapse of a predetermined period of time from the detection of the signal current by the second detection circuit.

6. The circuit according to claim 5, wherein the first detection circuit is a current detection circuit according to one of claims 1 to 4.

7. The circuit according to claim 5, wherein the first detection circuit and the second detection circuit are used in a shared manner.

8. The circuit according to claim 5, wherein when the count value becomes 2, the counter circuit resets the count value.

9. The circuit according to claim 5, further comprising a signal processing circuit to perform predetermined signal processing on the signal current, wherein
- when the second detection circuit detects the signal current, the control circuit allows the signal processing circuit to start signal processing, and
- when the count value becomes 2, the counter circuit resets the signal processing performed by the signal processing circuit.

10. The circuit according to claim 5, wherein
the control circuit includes:
- an RS flip-flop circuit having a set terminal through which a detection signal from the second detection circuit is input;
- a first delay circuit to output a delay signal obtained by delaying an output signal from the RS flip-flop circuit; and
- a first OR circuit to accept the delay signal and the pile-up detection signal and to input an output signal therefrom to a reset terminal of the RS flip-flop circuit.

11. The circuit according to claim 5, wherein
the counter circuit includes:
- a first D flip-flop circuit having an input terminal through which a predetermined signal is input and having a clock terminal through which a detection signal from the first detection circuit is input;
- a second D flip-flop circuit having an input terminal through which an output signal from the first D flip-flop circuit is input and having a clock terminal through which the detection signal from the first detection circuit is input;
- a second delay circuit to output a delay signal obtained by delaying an output signal from the second D flip-flop circuit; and
- a second OR circuit to accept an output signal from the second D flip-flop circuit and the delay signal, and to reset the first D flip-flop circuit and the second D flip-flop circuit, using an output signal therefrom.

* * * * *